(12) United States Patent
Nakamura (10) Patent No.: US 7,897,216 B2
(45) Date of Patent: Mar. 1, 2011

(54) METHOD FOR MANUFACTURING ORGANIC DEVICE AND ELECTRONIC APPARATUS

(75) Inventor: Kiyoshi Nakamura, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 355 days.

(21) Appl. No.: 12/069,241

(22) Filed: Feb. 9, 2008

(65) Prior Publication Data

US 2008/0199634 A1 Aug. 21, 2008

(30) Foreign Application Priority Data

Feb. 21, 2007 (JP) ............... 2007-040606

(51) Int. Cl.
| | |
|---|---|
| B05D 5/12 | (2006.01) |
| B05D 3/02 | (2006.01) |
| B05D 3/06 | (2006.01) |
| H01L 51/40 | (2006.01) |
| H01L 51/00 | (2006.01) |
| H01L 21/00 | (2006.01) |
| H01L 21/336 | (2006.01) |

(52) U.S. Cl. ............ 427/553; 427/555; 427/97.4; 427/97.5; 438/151; 438/99; 438/308

(58) Field of Classification Search ............ 438/99; 427/596, 558
See application file for complete search history.

(56) References Cited

U.S. PATENT DOCUMENTS

| | | | | |
|---|---|---|---|---|
| 6,403,396 B1* | 6/2002 | Gudesen et al. | ............ | 438/99 |
| 6,821,811 B2* | 11/2004 | Hirakata et al. | ............ | 438/82 |
| 6,864,118 B2* | 3/2005 | Stasiak | ............ | 438/99 |
| 6,919,128 B2* | 7/2005 | McCreery | ............ | 428/333 |
| 7,276,727 B2* | 10/2007 | Stasiak | ............ | 257/40 |
| 2002/0057398 A1* | 5/2002 | Ogawa | ............ | 349/61 |
| 2004/0056237 A1* | 3/2004 | Ogawa | ............ | 252/500 |
| 2005/0088079 A1* | 4/2005 | Daniels | ............ | 313/504 |
| 2005/0145839 A1* | 7/2005 | Yamamoto et al. | ............ | 257/40 |
| 2005/0151130 A1* | 7/2005 | Stasiak | ............ | 257/40 |
| 2007/0012950 A1* | 1/2007 | Cain et al. | ............ | 257/194 |
| 2007/0034865 A1* | 2/2007 | Yukawa | ............ | 257/40 |
| 2007/0249088 A1* | 10/2007 | Ohmori et al. | ............ | 438/99 |
| 2010/0193775 A1* | 8/2010 | Yutani et al. | ............ | 257/40 |

FOREIGN PATENT DOCUMENTS

| | | |
|---|---|---|
| JP | 10-012377 | 1/1998 |
| JP | 2005-223286 | 8/2005 |

* cited by examiner

Primary Examiner—Marianne L Padgett
(74) Attorney, Agent, or Firm—AdvantEdge Law Group, LLC (57) ABSTRACT

A method for manufacturing an organic device includes disposing a solution containing a conductive organic material in a first region on a substrate, drying the solution to form a conductive organic film in the first region, and irradiating the conductive organic film formed in a second region other than the first region with light to decrease the conductivity of the conductive organic film.

6 Claims, 9 Drawing Sheets

METHOD FOR MANUFACTURING ORGANIC DEVICE AND ELECTRONIC APPARATUS

BACKGROUND

1. Technical Field

The present invention relates to a technique for manufacturing an organic device using a conductive organic material.

2. Related Art

In recent years, organic devices using organic materials (conductive organic materials) having electric conductivity have been being developed. Organic devices are advantageous in that they are suitable for miniaturization and can be formed on a flexible substrate, and materials are inexpensive. Therefore, application to flexible displays has been investigated. For example, organic transistors and organic EL devices permit liquid processes such as an ink jet process using organic material solutions, thereby easily decreasing the process cost and facilitating the formation of large-area films. Therefore, this technical field is quite promising. In such an organic device, an ink jet process or a screen printing process is used for forming a film only in a specified region using an organic material solution, thereby realizing precise separate-coating (refer to, for example, Japanese Unexamined Patent Application Publication Nos. 2005-223286 and 10-12377).

The purposes of the above-described separate-coating include decreasing the amount of the solution used and the following. For example, a current leakage between adjacent fine wirings provided in a planar direction is decreased, and the electric characteristics are improved by optimization of a laminated structure. An example of improvement in the electric characteristics relates to an organic EL device. In an organic EL device, a luminescent layer, a hole injection layer, a hole transport layer, an electron transport layer, and an electron injection layer are laminated to realize an organic EL device with a high luminous efficiency.

Organic devices requiring separate-coating of an organic material include large-area devices such as a display and a solar cell, which are advantageously formed by a liquid process. However, in recent years, the density and area of circuits constituting an organic device have been increasingly increased, and thus a solution pattern has been required to be made finer and thinner. As the density and area are increasingly increased, the separate-coating requires an advanced technique, thereby increasing the probability of occurrence of a defect. For example, when a solution is applied by an ink jet process, the solution may spread to an unnecessary portion or may be scattered or mistakenly dropped, thereby increasing the parasitic capacitance or causing a leak path.

SUMMARY

An advantage of some aspects of the invention is that the invention provides a method for manufacturing an organic device capable of preventing the occurrence of parasitic capacitance and a leak path due to spread to an unnecessary portion, scattering, or dropping error, and also provides an electronic apparatus including the organic device and thus exhibiting high yield and excellent electric characteristics.

In accordance with an embodiment of the invention, a method for manufacturing an organic device includes disposing a solution containing a conductive organic material in a first region on a substrate, drying the solution to form a conductive organic film in the first region, and irradiating the conductive organic film disposed in a second region other than the first region with light to decrease the conductivity of the conductive organic film. In this method, the conductivity of the conductive organic film disposed in an undesired region (second region) can be decreased by light. Therefore, a thin film element can be formed with high precision in a desired region. Also, the size of a thin film element is not limited by wetting spread of the solution, and thus a thin film element of a size smaller than the coating area of the solution can be formed.

In the invention, the term "conductive organic material" represents an organic material having a certain degree of conductivity and has a wide concept including materials other than insulating organic materials. The conductive organic material includes organic conductive materials having metallic conductivity and organic semiconductor materials having semiconductivity. A film (conductive organic film) formed using a conductive organic material is used as a wiring layer, a semiconductor layer, or an electrode. An organic device including such a film represents a thin film transistor, a diode, a resistor, an inductor, a capacitor, a single element regardless of whether it is an active or passive element, a circuit (chip) such as an integrated circuit in which elements are integrated and wired so as to exhibit a predetermined function, a portion of a circuit in which a plurality of elements is combined, or the whole or part of an apparatus including at least one circuit such as an integrated circuit combined to exhibit a predetermined function. The constitution, shape, and size of the organic device are not limited.

In the present invention, "light" may be ultraviolet light or visible light as long as it destructs at least a portion involved in the electric conduction of a conductive organic film to be irradiated with light. In many organic films, the rate of progress of a structural change due to oxidation or the like is accelerated by irradiation of light such as ultraviolet light in the presence of oxygen or moisture. Therefore, ultraviolet light is most effective as the light. However, some $\pi$-conjugated organic materials are excited by visible light, and thus if the steric structure or configuration of molecules can be changed by visible light, conductivity can be greatly decreased by visible light. Since the energy of visible light is smaller than that of ultraviolet light, damage of light irradiation is small, and thus an organic device can be provided in high yield.

It is preferred that the conductive organic film is a $\pi$-conjugated organic film, and the light has a wavelength and energy with which the steric structure of a molecular skeleton involved in $\pi$-conjugation can be changed to cut $\pi$-electron orbital overlap in the molecular skeleton. This method can use light with smaller energy than that for physically breading a molecular bond by ultraviolet light or the like. Specifically, visible light can be used, and an organic device can be provided in high yield because irradiation with visible light causes little damage.

Also, it is preferred that the conductive organic film is a $\pi$-conjugated organic film, and the light has a wavelength and energy with which the conductive organic film can be oxidized in the presence of oxygen or moisture. This method is capable of localizing $\pi$-electrons in a portion where oxygen is added, thereby significantly decreasing conductivity. In addition, ultraviolet light is preferably used as the light, and thereby oxidation can be securely effected.

The light is a laser beam or light narrowed by a lens so that the second region can be selectively irradiated with the light. Alternatively, the second region can be irradiated with the light using a mask having a light-transmitting region which transmits the light. This method is capable of minimizing the damage of light irradiation even when ultraviolet light is used as the light.

A conductive layer which does not transmit light is formed in the first region so that the entire surface of the substrate can be irradiated with the light using the conductive layer as a mask. For example, as seen from the irradiation side, the conductive layer can be formed to cover a portion of the conductive organic film in the first region. More specifically, the conductive layer may be formed as a gate electrode of a thin film transistor, and a portion of the conductive organic film can be formed as a channel region of the thin film transistor. This method does not require an exposure mask because the conductive layer formed as a portion of the organic device is used as the mask. Therefore, the manufacturing process can be simplified to decrease the process cost.

After the conductive organic film is formed, the conductive organic film is annealed. The annealing step is preferably performed after the conductive organic film is irradiated with the light. The annealing is performed for improving the orientation state of the conductive organic material and improving electric conductivity (hopping conduction) between molecules. However, when light irradiation is conducted after the conductive organic material is oriented (after annealing), the effect of light irradiation is limited because the hopping conduction of the conductive organic material has been improved. While when light irradiation is conducted before the conductive organic material is oriented (before annealing), orientation (liquid crystallinity) of the conductive organic material is decreased by a change in the molecular skeleton of the conductive organic material, and thus hopping conduction cannot be sufficiently expected even by annealing. Therefore, when light irradiation is conducted before annealing, the conductivity of the conductive organic film can be decreased, thereby increasing the effect.

In accordance with another embodiment of the invention, an electronic apparatus includes an organic device manufactured by the above-described method for manufacturing the organic device. By using this construction, an electronic apparatus having high yield and excellent electric characteristics can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will be described with reference to the drawings. These embodiments show an aspect of the invention, and the invention is not limited to the embodiments. In each of the embodiments, the shapes of components and combinations thereof are only examples, and various modifications can be made on the basis of design requirements and the like within the scope of the gist of the invention. In each of the drawings, the contraction scale and the number of components are different from those in an actual structure, for making the constitution easily understandable.

In the description below, a XYZ orthogonal coordinate system is set, and a positional relation of each member is described with reference to the XYZ orthogonal coordinate system. In this case, a predetermined direction in a horizontal plane is the X-axis direction, a direction orthogonal to the X-axial direction in the horizontal plane is the Y-axis direction, and a direction orthogonal to (i.e., a vertical direction) the X-axis direction and the Y-axis direction is the Z-axis direction. For example, in each of the embodiments, the X-axis direction coincides with the extension direction of scanning lines, the Y-axis direction coincides with the extension direction of data lines, and the Z-axis direction coincides with the observation direction of an observer.

First Embodiment

Figure 1:
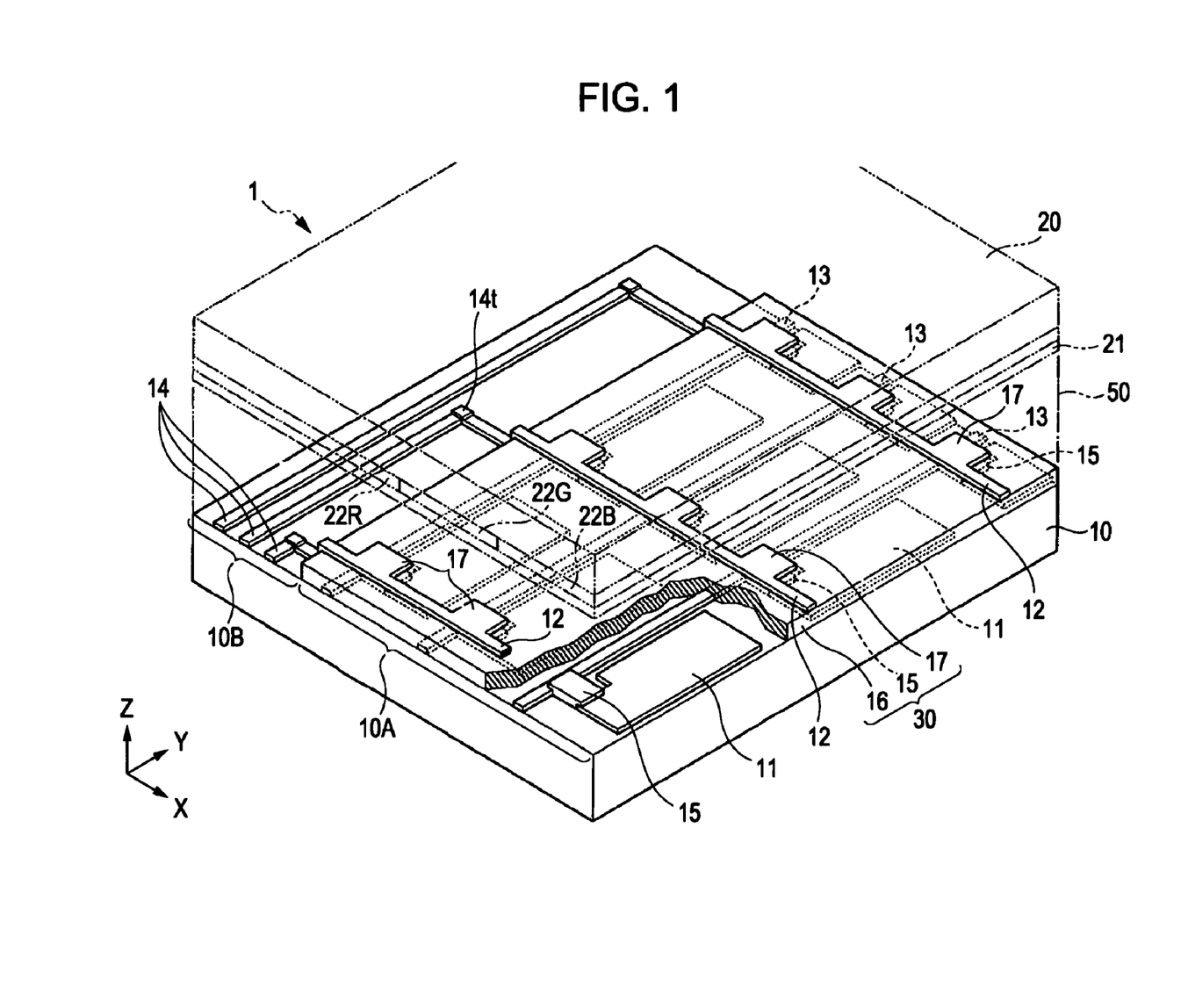
FIG. 1 is a schematic drawing of the constitution of an electro-optic device according to a first embodiment of the invention.

FIG. 1 is a schematic drawing showing the construction of an electro-optic device 1 including organic thin-film transistors 13 as organic devices according to an embodiment of the invention. The electro-optic device 1 includes a first substrate 10 and a second substrate 20 which are opposed to each other, and an electro-optic layer 50 sandwiched between the first and second substrates 10 and 20.

The electro-optic layer 50 is provided with an electro-optic material such as a liquid crystal, an electrophoretic dispersion liquid, or the like. In this embodiment, the electro-optic layer 50 is provided with an electrophoretic dispersion liquid containing one or more electrophoretic particles dispersed in a dispersion medium. The electrophoretic particles are fine particles composed of an inorganic oxide such as $TiO_2$ or an inorganic hydroxide having a diameter of about 0.01 to 10 μm, and the surface density of charge (charge amount) of the particles is controlled by the hydrogen ion exponent PH of the dispersion medium. The electrophoretic particles migrate by an electric field between a pixel electrode 11 and a counter electrode 21 and adhere to the surface of one of the electrodes to display an image. The electrophoretic particles may be sealed in microcapsules.

In addition, a plurality of pixel electrodes 11 is provided on the electro-optic layer side of the first substrate. The pixel electrodes 11 are arrayed in the X-axis direction and the Y-axis direction, and a plurality of data lines 13 is provided along the spaces between the respective pixel electrodes to extend in the Y-axis direction. A region in which each of the pixel electrodes 11 is disposed forms a sub-pixel as the minimum unit of display, and the sub-pixels are arrayed in the X-axis direction and the Y-axis direction to form a display region 10A as a whole.

An organic thin film transistor (abbreviated as an "organic TFT" hereinafter) 30 serving as an organic device is provided between each of the pixel electrodes 11 and the corresponding data line 13. The organic TFT 30 includes a long semiconductor layer 15 elongated in the X-axis direction, a gate insulating film 16 covering the semiconductor layer 15, and a gate electrode 17 opposing to the semiconductor layer 15 with the gate insulating film 16 provided therebetween.

The semiconductor layer 15 is an organic semiconductor layer composed of an organic semiconductor material and is provided over each pixel electrode 11 and the corresponding data line 13. The semiconductor layer 15 is provided to overlap a portion of the corresponding data line 13 so that the semiconductor layer 15 is electrically connected to the corresponding data line 13 in an overlap portion therebetween (source contact portion). Further, the semiconductor layer 15 is provided to overlap a portion of each of the pixel electrodes 11 so that the semiconductor layer 15 is electrically connected to each pixel electrode 11 in an overlap portion therebetween (drain contact portion).

The gate insulating film 16 is provided to cover the pixel electrodes 11, the data lines 13, and the semiconductor layers 15. The gate insulating film 16 is provided over the entire surface of the display region 10A. Further, a plurality of scanning lines 12 is provided on the gate insulating film 16 to extend along the spaces between the respective pixel electrodes 11 in the X-axis direction. Each of the scanning lines 12 is provided with projections projecting in the Y-axis direction so that the projections serve as the respective gate electrodes 17. The gate electrodes 17 are provided opposite to the respective semiconductor layers 15, and a channel region of each semiconductor layer 15 is formed in a planar overlap portion therebetween. Each of the gate electrodes 17 is provided over each pixel electrode 11 and the corresponding data line 13. The width of the gate electrodes 17 in the X-axis direction is larger than the space (channel length) between the corresponding data line 13 (source contact portion) and each pixel electrode 11 (drain contact portion) so that the region from the source contact portion to the drain contact portion in each semiconductor layer 15 is covered with each gate electrode 17.

Further, wiring regions 10B are provided around the display region 10A. In the wiring regions 10B, lead wirings 14 electrically connected to the scanning lines 12 are provided. The gate insulating film 16 is not provided in the wiring regions 10B, and the scanning lines 12 are drawn out to the wiring regions 10B so as to cover the edges of the gate insulating film 16. Each of the scanning lines 12 is provided so as to overlap a portion of the lead wirings 14. In an overlap portion between each scanning line 12 and the corresponding lead wiring 14, both are electrically connected to each other. Although not shown in the drawings, the ends of the scanning lines 12 are led out alternately in the rightward and leftward directions toward the wiring regions 10B. In each wiring region 10B, a plurality of conduction terminals 14t is provided to each correspond to any one of the plurality of scanning lines 12. In the left wiring region 10B shown in the drawing, the plurality of conduction terminals 14t is provided to each correspond to any one of the scanning lines in the even-number rows, while in the right wiring region 10B shown in the drawing, the plurality of conduction terminals 14t is provided to each correspond to any one of the scanning lines in the odd-number rows. One of the ends of each scanning lines 12 is extended to either the right or right wiring region 10B and electrically connected to any one of the conduction terminals 14t.

In the wiring regions 10B, the plurality of lead wirings 14 is provided so as to each correspond to any one of the plurality of conduction terminals 14t. The lead wirings 14 are extended in the Y-axis direction along the periphery of the display region 10A so that the ends of the lead wirings serve as the conduction terminals 14t. The lead wirings 14 and the conduction terminals 14t are formed by, for example, the same step as that of the data lines 13 using the same material. The lead wirings 14 and the data line 13 are led to a terminal portion (not shown) of the first substrate 10 and are electrically connected to external terminals formed in the terminal portion.

Further, a color filter 22 is provided on the electro-optic layer side of the second substrate 20. The color filter 22 includes a plurality of color layers 22R, 22G, and 22B having different colors. The color layers 22R, 22G, and 22B are formed in stripes extending in the Y-axis direction so as to be arranged in the order of red (R), green (G), and blue (B) in the X-axis direction. The color layer of one of the primary colors (R, G, B) is disposed in each sub-pixel so that the three sub-pixels form one pixel including the three color layers 22R, 22G, and 22B. Further, the counter electrode 21 is provided on the electro-optic layer side of the color filter 22. The counter electrode 21 is provided to cover the entire surface of the display region 10A so as to serve as a common electrode common to the pixel electrodes 11.

A method for manufacturing the electro-optic device is described with reference to FIGS. 2 to 6. The steps for manufacturing the first substrate are mainly described with reference to FIGS. 2 to 6, and description of the other steps is omitted.

Figure 2:
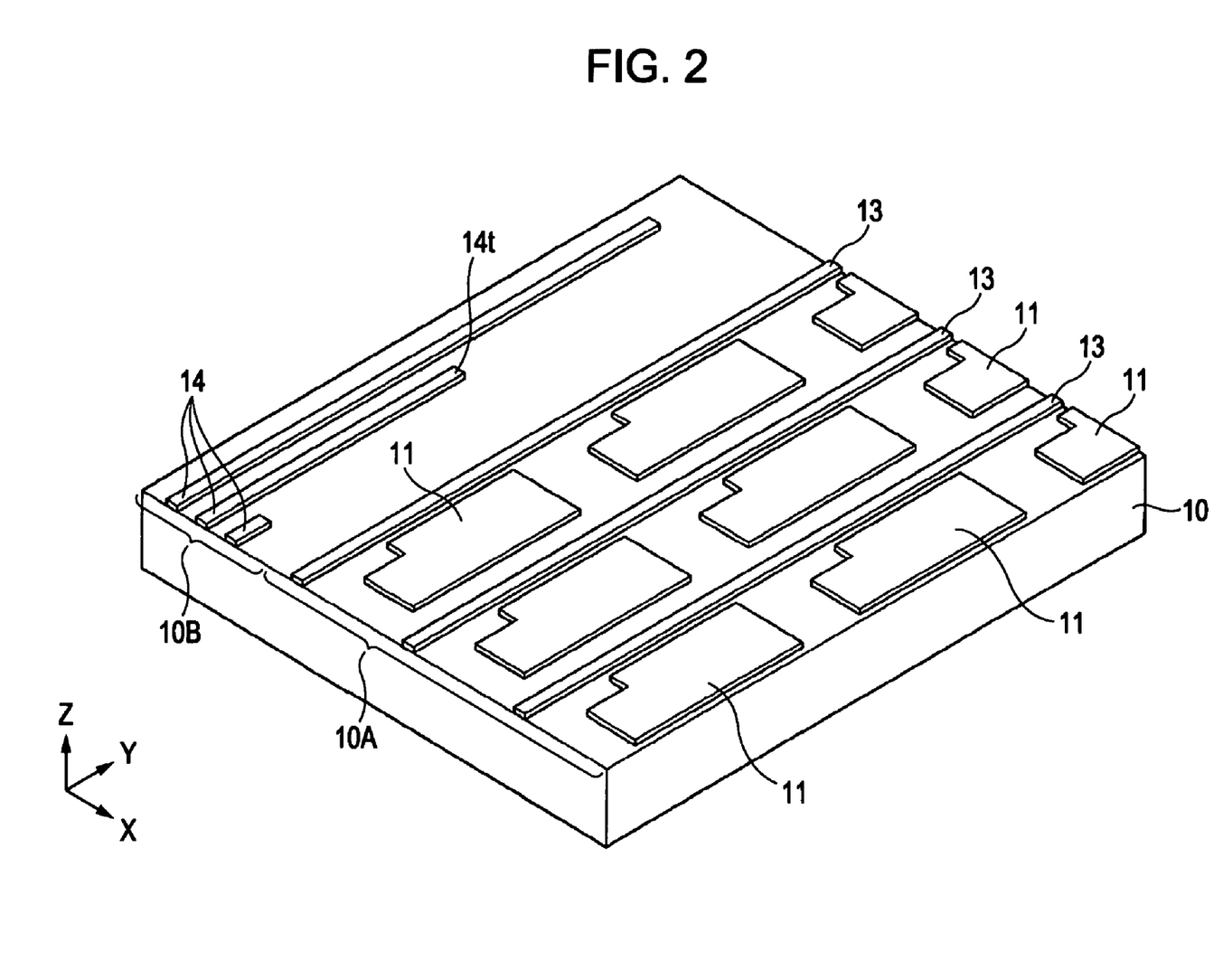
FIG. 2 is a drawing illustrating a method for manufacturing the electro-optic device shown in FIG. 1.

As shown in FIG. 2, first, the data lines 13, the lead wirings 14, and the pixel electrodes 11 are formed on the first substrate 10. As the first substrate 10, a glass substrate, a plastic substrate (resin substrate) composed of polyimide, polyethylene terephthalate (PET), polyethylene naphthalate (PEN), poly(methyl methacrylate) (PMMA), polycarbonate (PC), polyether sulfone (PES), or aromatic polyester (liquid crystal polymer), a quartz substrate, a silicon substrate, or a gallium arsenide substrate can be used. When flexibility is imparted to the electro-optic device 1, a resin substrate is selected as the first substrate 10.

Materials for the data lines 13, the lead wirings 14, and the pixel electrodes 11 include conductive materials such as Pd, Pt, Au, W, Ta, Mo, Al, Cr, Ti, and Cu and alloys thereof, conductive oxides such as ITO (indium tin oxide), FTO (fluorine-doped tin oxide), ATO (antimony-doped tin oxide), and $SnO_2$, carbonaceous materials such as carbon black, carbon nanotubes, and fullerence, and conductive polymer materials such as polyacetylene, polypyrrole, polythiophene such as PEDOT (poly-ethylenedioxythiophene), polyaniline, poly(p-phenylene), polyfluorene, polycarbazole, and polysilane, and derivatives thereof. These materials can be used alone or in combination of two or more. The conductive polymer materials are generally used in a state in which each of the materials is doped with iron oxide, iodine, an inorganic acid, an organic acid, or a polymer such as polystyrenesulfonic acid and imparted with conductivity.

Figure 3:
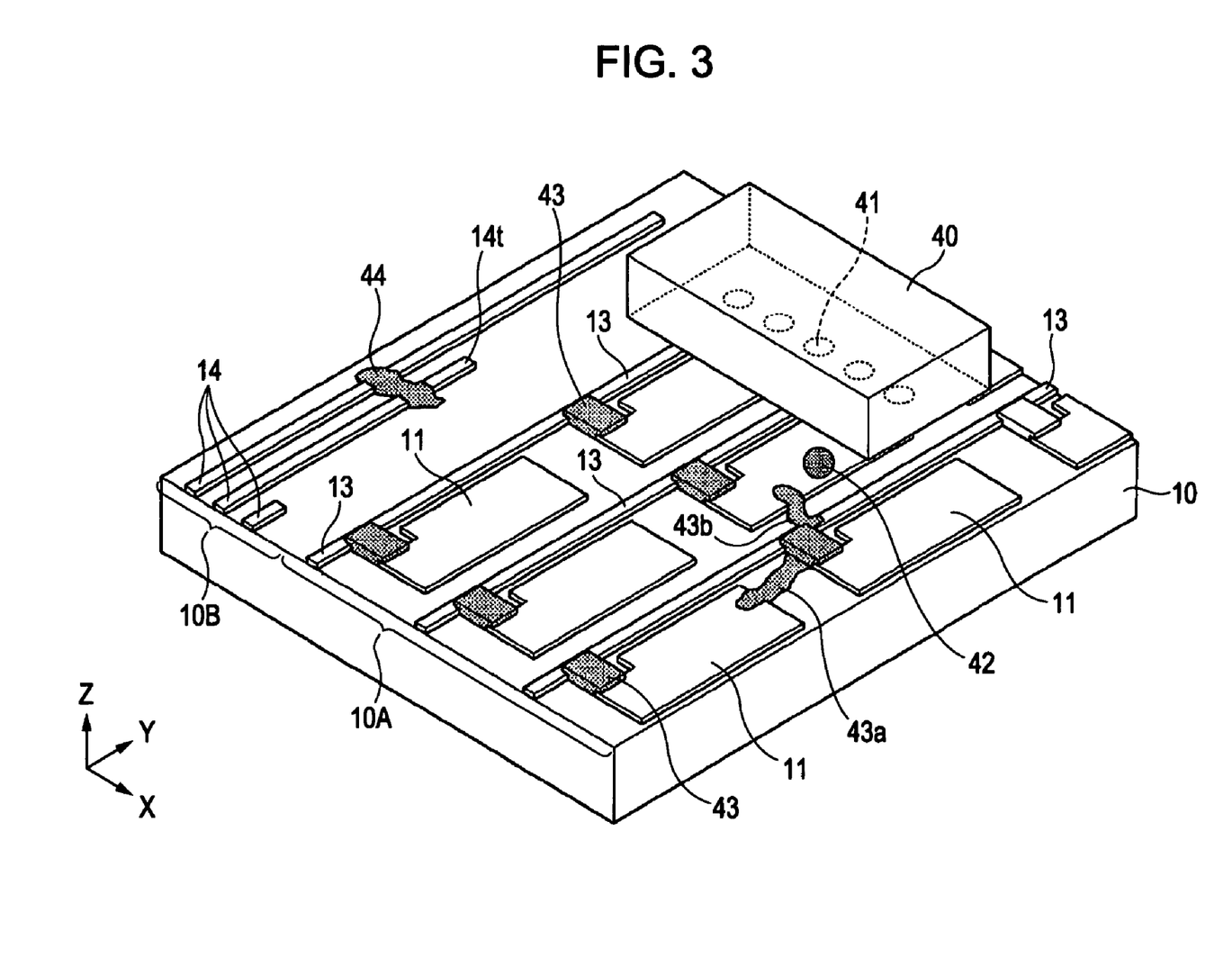
FIG. 3 is a drawing illustrating a method for manufacturing the electro-optic device shown in FIG. 1.

Next, as shown in FIG. 3, a semiconductor layer is formed (first region) between each of the pixel electrodes 11 and the corresponding data line 13 using a liquid process. Examples of the liquid process include an ink jet method, a spin coating method, a dipping method, a roll coating method, a casting method, a micro-gravure coating method, a gravure coating method, a bar coating method, a roll coating method, a wire bar coating method, a spray coating method, and various printing methods such as a screen printing method, a flexographic printing method, an offset printing method, and a micro-contact printing method. Among these methods, the ink jet method is preferably used because it has high thickness controllability and can precisely control an ejection position. In this embodiment, an organic semiconductor material which is a conductive organic material is dispersed or dissolved in a solution 42, and the solution 42 is charged in an ink jet head 40. The ink jet head 40 and the first substrate 10 are relatively moved so that the solution 42 is ejected in a controlled amount per droplet between the data lines 13 and the pixel electrodes 11 from nozzles 41 of the ink jet head 40. The coated films 43 of the solution 42 are dried to form semiconductor layers.

Examples of the organic semiconductor material include organic semiconductor materials with low molecular weights, such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, oligothiophene, and phthalocyanine, and derivatives thereof; and organic semiconductor materials with high molecular weights, such as poly-N-vinylcarbazole, polyvinylpyrene, polyvinylanthracene, polythiophene, polyhexylthiophene, poly(p-phenylenevinylene), polythienylenevinylene, polyarylamine, pyrene-formaldehyde resin, ethylcarbazole-formaldehyde resin, fluorene-bithiophene copolymers, fluorene-arylamine copolymers, and derivatives thereof. These materials can be used alone or in combination of two or more. Among these materials, a π-conjugated organic semiconductor material in which π-conjugations are one-dimensionally connected is preferably used because high mobility can be obtained. The π-conjugated organic semiconductor material has particularly high carrier mobility due to the specific spread of electron clouds, and high mobility corresponding to amorphous silicon is realized by a low-molecular-weight organic semiconductor material such as pentacene or the like.

As such an organic semiconductor material, a high-molecular-weight organic semiconductor material is preferably used because a film can be easily formed by the liquid process. However, a low-molecular-weight organic semiconductor material may be used. The low-molecular-weight organic semiconductor material is generally deposited by a vapor deposition method, but there have recently been reported an example using a precursor and an example in which the organic semiconductor material is dispersed or dissolved directly in a solvent and then applied to form a film. For example, J. AM. CHEM. SOC. 124 (2002) 8812, Ali Afzali, Christos D. Dimitrakopoulos, and Tricia L. Breen and Adv. Mater. 11 (1990) 490, Peter T. Herwig and Klaus Mullen disclose a method including applying a solution of a solvent-soluble precursor and effecting an elimination reaction by heating to obtain pentacene. Also, Applied Phsics Letters, 84 (2004) 2085, Shinji Aramaki et al. discloses a method of forming a film by a liquid process using a porphyrin organic semiconductor material with a low molecular weight. In this method, the porphyrin low-molecular material used as a precursor is decomposed by heating after film formation. As a result, a molecular structure has high planarity, thereby realizing a π-conjugated system.

Figure 4:
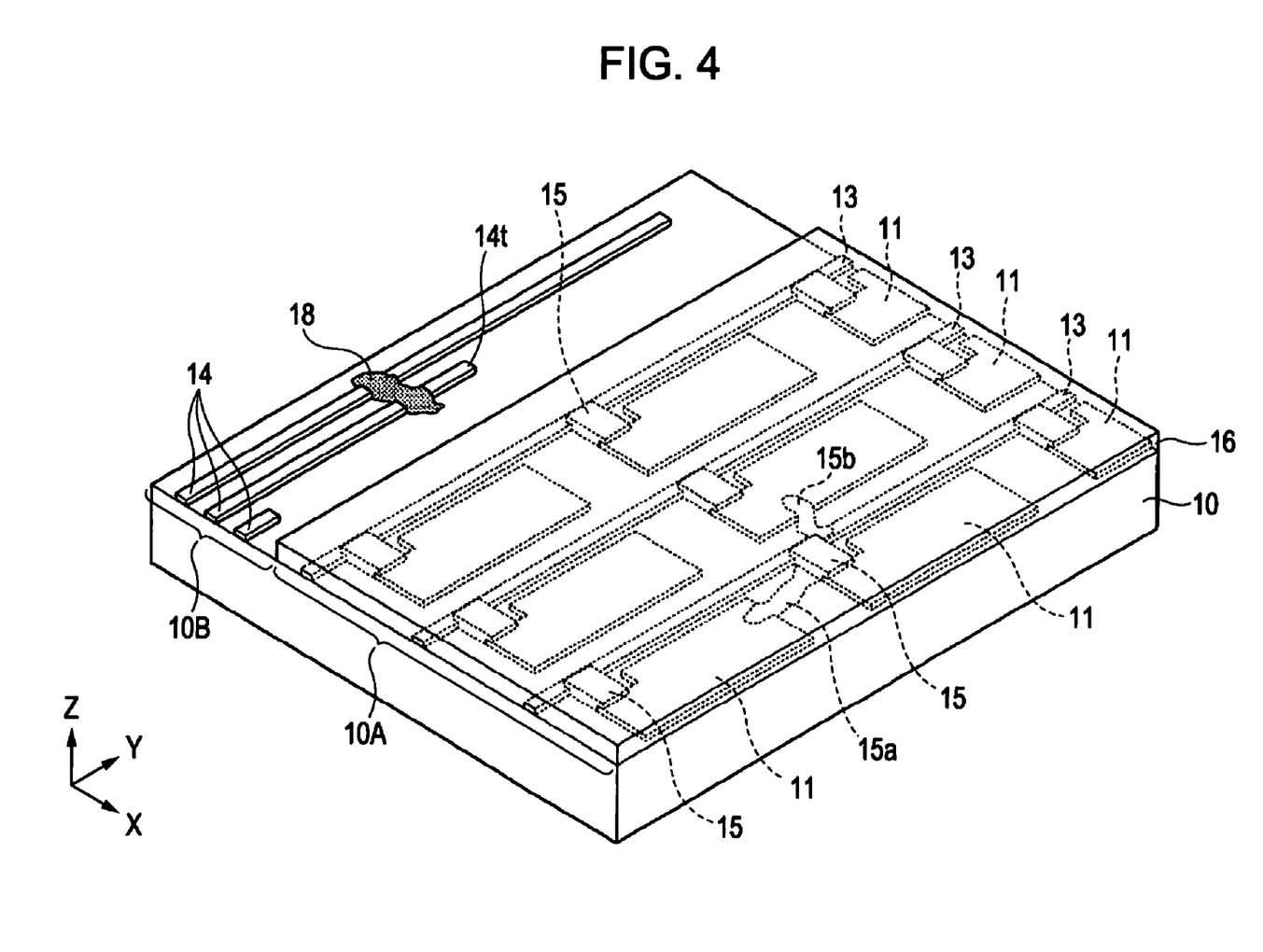
FIG. 4 is a drawing illustrating a method for manufacturing the electro-optic device shown in FIG. 1.

Next, as shown in FIG. 4, the coated films formed between the data lines 13 and the pixel electrodes 11 are dried to form the semiconductor layers 15 as conductive organic films. The semiconductor layers 15 are heated (annealed) to a temperature (Tg±50° C.) near the glass transition temperature Tg. The annealing aligns the orientation of the organic semiconductor and increases conductivity (hopping conduction) between the organic semiconductor layers. Further, the gate insulating film 16 is formed to cover the pixel electrodes 11, the data lines 13, and the semiconductor layers 15. The gate insulating film 16 is formed over the entire surface of the display region 10A excluding the wiring regions 10B.

Preferably the gate insulating film 16 is mainly composed of an organic material (particularly an organic polymer material). The gate insulating film 16 composed of an organic material as a main component exhibits high adhesion to the semiconductor layers 15 composed of an organic semiconductor. In particular, the gate insulating film 16 composed of an organic polymer material as a main material can be easily formed by the liquid process. Examples of such an organic polymer material include polystyrene, polyimide, polyamide-imide, polyvinylphenylene, polycarbonate (PC), acrylic resins such as polymethyl methacrylate (PMMA), fluorocarbon resins such as polytetrafluoroethylene (PTFE), phenolic resins such as polyvinyl phenol and novolac resin, and olefin resins such as polyethylene, polypropylene, polyisobutylene, and polybutene. These materials can be used alone or in combination of two or more.

The gate insulating film 16 is preferably composed of a material having high transmittance for light L (refer to FIG. 6) applied in a subsequent light irradiation step described below. As described below, the light L is light at a wavelength which can be absorbed by the semiconductor layers 15, and thus a material of the gate insulating film 16 is selected according to the material of the semiconductor layers 15 so as not to deteriorate the gate insulating film 16 by the light L.

In order to form the gate insulating film 16, a masking tape is preferably previously disposed in the wiring regions 10B. As the masking tape, a known adhesive tape can be used. When the masking tape is used, the wiring regions 10B can be exposed by removing the masking tape after the gate insulating film 16 is formed over the entire surface of the substrate.

Figure 5:
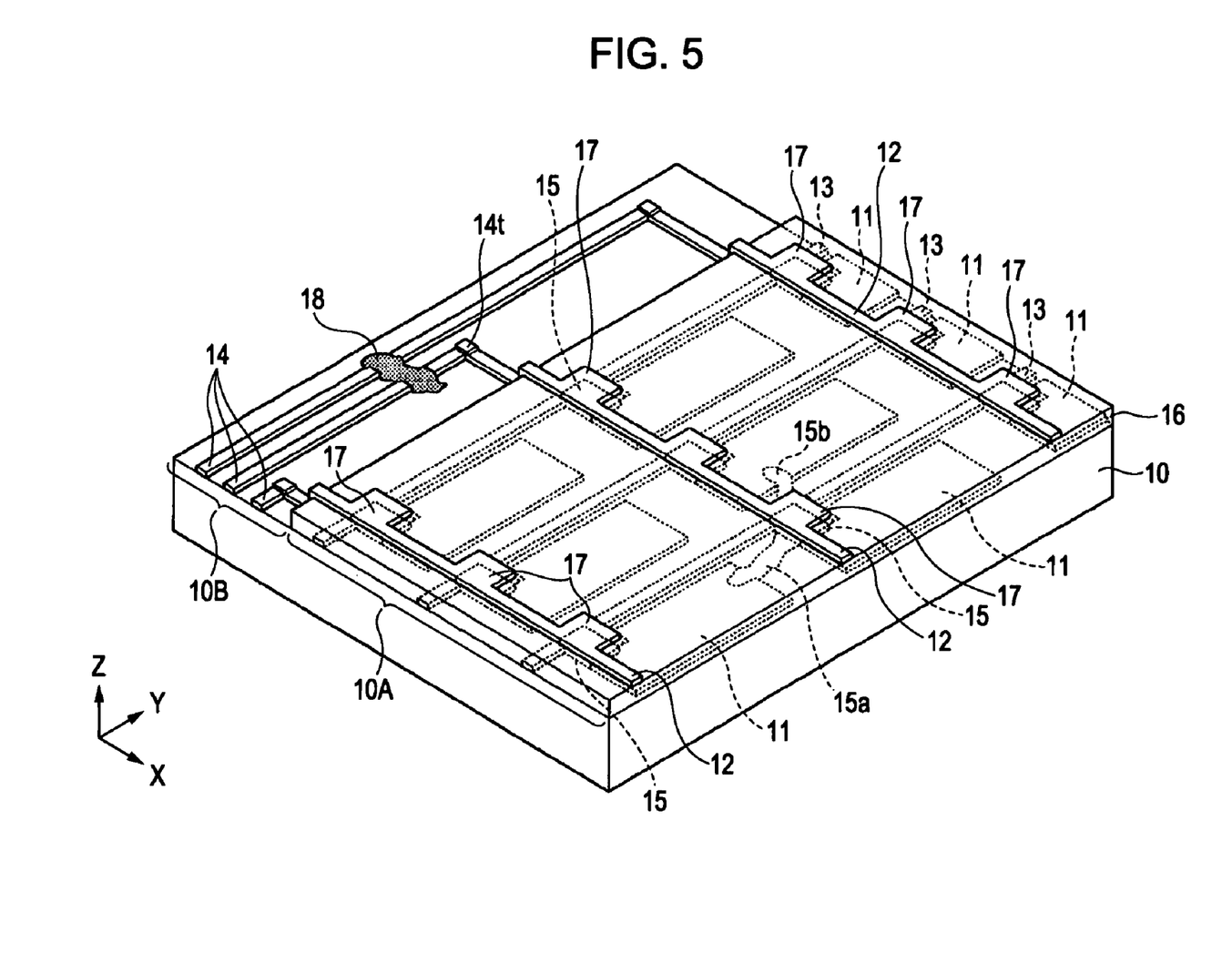
FIG. 5 is a drawing illustrating a method for manufacturing the electro-optic device shown in FIG. 1.

Next, as shown in FIG. 5, the scanning lines 12 and the gate electrodes 17 are formed on the gate insulating film 16. The scanning lines 12 are formed so that one of the ends of each scanning line 12 is drawn out to one of the wiring regions 10B and overlap the corresponding conduction terminal 14t of the lead wirings 14. Examples of materials of the scanning lines 12 and the gate electrodes 17 include Ag, Pd, Pt, Au, W, Ta, Mo, Al, Cr, Ti, Cu, and Ni, and alloys thereof, indium tin oxide (ITO), indium oxide (IO), indium zinc oxide (IZO), antimony tin oxide (ATO), and tin oxide ($SnO_2$). These materials can be used alone or in combination of two or more. Other conductive materials include the conductive polymer materials used for the data lines 13 and the pixel electrodes 11.

When the semiconductor layers 15 are formed by the liquid process as shown in FIG. 3, the applied solution 42 may spread to an unnecessary portion or may be scattered or mistakenly dropped. In FIG. 3, reference numeral 43a denotes a coated film 43 spread by wetting to the adjacent pixel electrode 11 beyond the corresponding scanning line 12. Reference numeral 43b denotes a coated film 43 spread by wetting to the adjacent pixel electrode 11 beyond the corresponding data line 13. Reference numeral 44 denotes a coated film 43 disposed between the lead wirings 14 by scattering or dropping error. When the coated films 43a, 43b, and 44 are dried to form semiconductor layers, a current leakage occurs between the pixel electrodes 11 or between the lead wirings 14. In addition, the semiconductor layers 15 are extended by the coated films 43a and 43b, and thus the parasitic capacitances between the gate electrodes 17 and the data lines 13 or between the gate electrodes 17 and the pixel electrodes 11 are increased to cause display devices.

Figure 6:
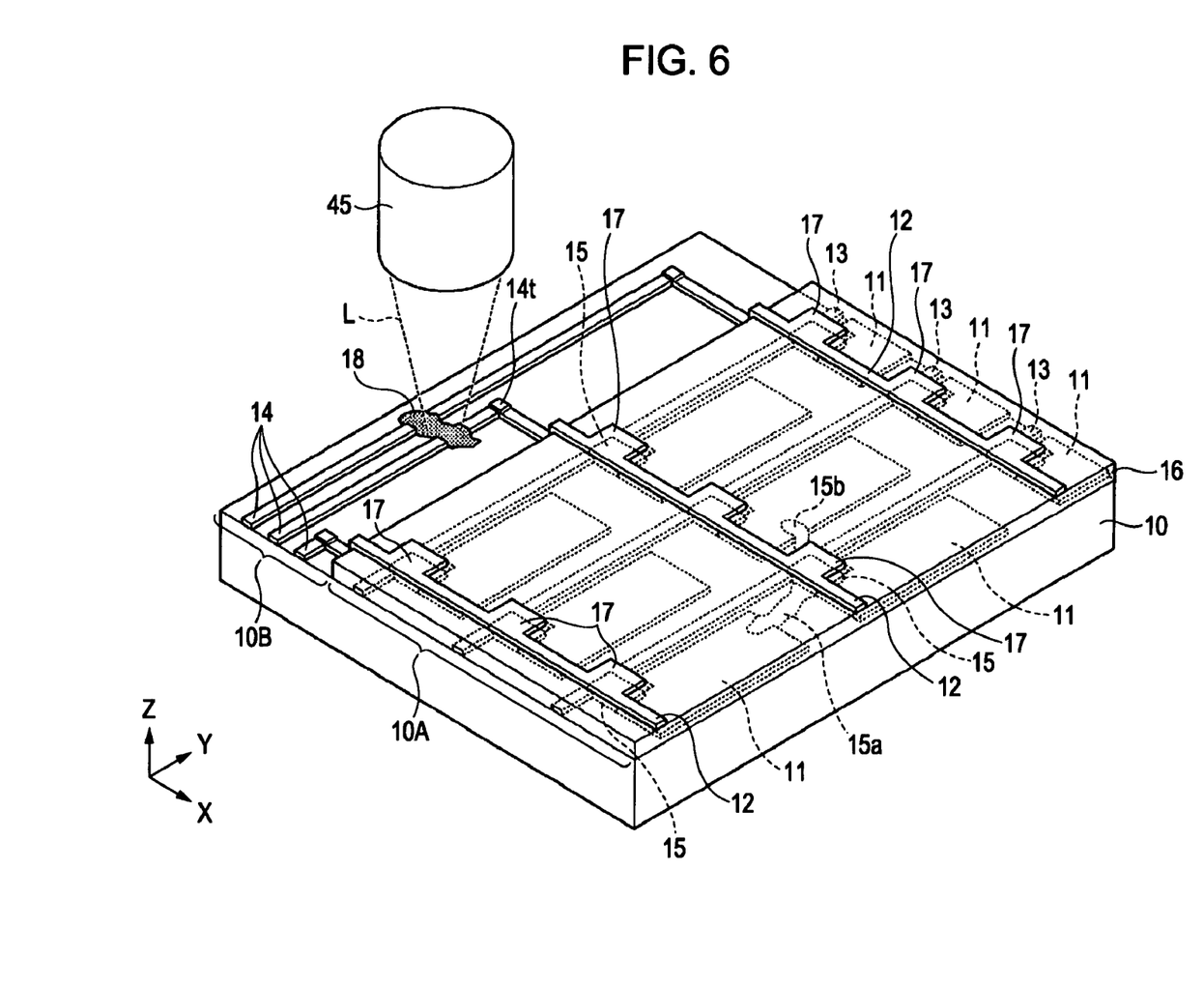
FIG. 6 is a drawing illustrating a method for manufacturing the electro-optic device shown in FIG. 1.

In this embodiment, therefore, as shown in FIG. 6, the semiconductor layers 18, 15a, and 15b disposed in unnecessary portions (second region) are irradiated with the light L using a light source 45 in order to decrease the conductivity of the organic semiconductor material constituting the semiconductor layers 18, 15a, and 15b. The light L may be either ultraviolet light or visible light as long as at least a portion involved in the electric conduction of the organic semiconductor material as a target is destructed. As the light L, a laser beam may be used, or light narrowed by a lens may be selectively applied to the semiconductor layers 18, 15a, and 15b.

The light L may be light having a wavelength and energy with which the organic semiconductor material of the semiconductor layers 18, 15a, and 15b can be oxidized in the presence of oxygen or moisture. As such light, ultraviolet light is preferably used. This is because in many organic films, the rate of progress of a structural change due to oxidation or the like is accelerated by ultraviolet irradiation in the presence of oxygen or moisture. When a portion involved in π-conjugation is oxidized, π-electrons can be localized in a specified region (e.g., a portion in which oxygen is added by oxidation), thereby significantly decreasing conductivity.

The wavelength of ultraviolet light is preferably about 200 nm to 350 nm. The ultraviolet light at this wavelength can advance oxidation reactions of most organic materials. The reason why the ultraviolet light at the wavelength concerns in oxidation is that its energy is sufficient to cut a C—C bond and a C═C bond in a benzene ring. For example, the energy of a C═C bond (conjugated double bond) of a benzene ring, which is considered as a main skeleton of an organic semiconductor, is about 530 kJ/mol and is cut by ultraviolet light at a wavelength of 225 nm or less. Similarly, the bond energy of an alkyl group ($CH_2$) introduced to a side chain in order to improve solubility or orientation is about 347 kJ/mol and is decomposed by light at a wavelength of 345 nm or less.

TABLE 1

| Bond | Bond energy (kJ/cm$^2$) | Wavelength (nm) |
|---|---|---|
| C≡C | 828 | 144 |
| C═O | 724 | 165 |
| C═C | 607 | 197 |
| C═C (benzene) | 530.5 | 225 |
| O═O | 490.4 | 244 |
| O—H | 462.8 | 258 |
| C—H | 413.4 | 289 |
| C—O | 351.5 | 340 |
| C—C | 347.7 | 344 |
| C—N | 291.6 | 410 |
| O—O | 138.9 | 861 |

The molecules decomposed by ultraviolet light become radicals, ions, or neutral molecules with high reactivity. Further, radicals react with oxygen or the like to be converted to an oxide. For example, when a C—H bond is cut by ultraviolet light, a reaction proceeds according to the following series of autoxidation mechanisms, and molecules are likely to be changed to molecules without conductivity due to the disappearance of π-conjugation system with a steric structural change in the molecules. In the following chemical formulae, R represents an alkyl group, and "." represents an unpaired electron.

<Initiation Process>: Initiation with Ultraviolet Irradiation

RH→H.+R.

<Progress Process>

R.+O$_2$→ROO.

ROO.+RH→ROOH+R.

ROOH→HO.+RO.

ROOH+RH→RO.+H$_2$O+R.

2ROOH→RO.+ROO.+H$_2$O

<Termination Process>

R.+R.→R—R

R.+RO.→R—O—R . . . inactive substance (termination reaction)

RO.+RO.=ROOR

ROO.+ROO.→ROOR+O$_2$

R.+HO.→ROH

The light L may be light having a wavelength and energy with which π-electron orbital overlap in a molecular skeleton involved in π-conjugation can be cut by a change in the steric structure of the molecular skeleton. As such light, visible light can be used. Since the energy of visible light is smaller than that of ultraviolet light, damage of light irradiation is decreased.

The expression "π-electron orbital overlap is cut" means that π-electron orbits do not interact therebetween due to the action of steric hindrance which is caused by the introduction of a substituent. Specifically, the expression means a state in which π-electron orbits of two unsaturated bonds at both ends of a single bond are not present in the same plane. In general, an interaction little occurs as the plane angle increases from 0° to 90°, and the interaction becomes the least at an angle of 90°. When π-electron orbital overlap is cut, charge migration in the molecular skeleton is inhibited, thereby significantly decreasing conductivity of an organic film as a whole. The cutting of π-electron orbital overlap may be expressed by "π-conjugation is cut".

It is considered that when two π-electron orbits are present in the same plane, an interaction most easily occurs to stabilize the orbits, and when two π-electron orbits are perpendicular to each other, an interaction least occurs to instabilize the orbits. The unstable electron orbits can be excited by light with small energy. For example, π-electron orbits can be excited by visible light in order to introduce a new substituent in a molecular skeleton. In this case, a molecular steric structure is changed by the steric hindrance of the substituent, and π-electron orbital overlap is cut. Also, π-electron orbits can be excited by visible light in order to remove a substituent originally present in a molecular skeleton. In this case, π-electron orbital overlap can be cut by a change in the molecular steric structure.

Next, description will be made with reference to organic semiconductor materials of the formulae (1) to (5) below. Any one of the formulae (1) to (5) shows a molecular skeleton in which an alkyl group is introduced as a side chain to a thiophene ring. The reasons for introducing a side chain into an organic semiconductor material are roughly divided into a case in which improvement in solubility is expected and a case in which not only solubility but also planarity of a skeleton portion involved in π-conjugation are expected. F8 of the formula (1), F8BT of the formula (2), and F8T2 of the formula (3) correspond to the former case, and P3HT of the formula (4) and PQT of the formula (5) correspond to the latter case. The cases have a common point that the introduction of a side chain causes steric hindrance in a molecule, and the planarity is maintained by the balance of the hindrance. The reason for improving the planarity is that stacking (orientation) between molecules is improved by improving the planarity, and thus conductivity is improved by π-electron orbital overlap between adjacent molecules. Further, when the planarity is improved, there is also the effect of causing molecules to exhibit liquid crystallinity and improving hopping conduction by molecular orientation.

(1)

(2)

(3)

(4)

(5)

When such an organic semiconductor material is irradiated with light, a molecular bond between a side chain and a main chain and a molecular bond in a side chain are cut depending on irradiation energy. As a result, the balance kept by the steric hindrance in a molecule is broken, thereby changing the planarity of the main chain and decreasing (cutting) the spread of π-conjugation. When orientation is decreased by the planarity of a molecule, conductivity due to hopping conduction is also lost, and thus electric characteristics are further decreased.

For the materials (the formulae (1) to (3)) having a fluorene skeleton, it is known that the deterioration mechanism shown below occurs. In this deterioration mechanism, an alkyl-substituted portion of a thiophene ring is oxidized to substitute an oxygen atom for the alkyl group. In this reaction, since an oxygen atom having a low molecular weight is introduced in place of an alkyl group having a high molecular weight, the steric balance in a molecule is broken to lose the planarity of a molecule as a whole. Also, since an oxygen atom has an electron-withdrawing property, electrons nonlocalized over the entire molecule are localized near the oxygen atom, thereby cutting or losing π-conjugation system.

(6)

Next, description will be made with reference to an organic semiconductor material (BFTT) of formula (7) as an example, The organic semiconductor material of the formula (7) has a molecular skeleton having two thiophene rings bonded at the center and two fluorene rings bonded at both sides of the thiophene rings. The organic semiconductor material has high planarity and electrons which are nonlocalized over the entire molecule. However, when the five-membered rings at the center are oxidized by light, the electrons are localized by the strong electron-withdrawing property of an oxygen atom, thereby cutting or losing π-conjugation. For example, it has been reported that when the organic semiconductor material is irradiated with blue light (50 mW/cm$^2$) at a wavelength of 380 nm in an air atmosphere for 6 hours, the conductivity is decreased to about ¹/₁₀ (Yong-Young Noh et. al., Appl. Phys. Lett., 85 (2004) 2953). According to a simple calculation, it is thought that the same effect can be obtained by irradiation with commercially available ultraviolet light at an irradiation intensity of several tens W/cm$^2$ within 0.36 seconds.

(7)

After the first substrate 10 is completed as described above, the electro-optic layer is formed on either the first substrate or the second substrate, and both substrates are bonded together. Alternatively after the first substrate and the second substrate are bonded together, the electro-optic layer is formed between both substrates. As a result, the electro-optic device shown in FIG. 1 is completed.

As described above, in this embodiment, the conductivity of the semiconductor layers 18, 15a, and 15b disposed in undesired portions is decreased by the light L, and thus the organic TFTs 30 can be precisely formed in desired regions. Also, since the size of the organic TFTs 30 is not limited by wetting spread of the solution 42, the organic TFTs 30 of a size smaller than the coating area of the solution 42 can be formed. In addition, since a laser beam or light narrowed by a lens is used as the light L, damage of light irradiation can be decreased even when ultraviolet light is used as the light L.

Although, in this embodiment, light irradiation of the semiconductor layers 18, 15a, and 15b is performed after annealing, irradiation may be performed before annealing. The annealing is performed for improving the orientation state of an organic semiconductor material to improve electric conductivity (hopping conduction) between molecules. However, when light irradiation is performed after the organic semiconductor material is oriented (after annealing), the effect of light irradiation is limited because the hopping conduction between organic semiconductor material molecules has been improved. However, when light irradiation is performed before the organic semiconductor material is oriented (before annealing), the orientation (liquid crystallinity) of the organic semiconductor material is decreased by a change in the molecular skeleton thereof. Therefore, sufficient hopping conduction cannot be expected even by annealing. Thus, when light irradiation is performed before annealing, the conductivity of the semiconductor layers 18, 15a, and 15b can be decreased, thereby exhibiting a large effect.

Although, in this embodiment, the organic TFT 30 is described as an example of organic devices, the organic device of the present invention is not limited to the organic TFT 30. For example, when the scanning lines 12, the data lines 13, the lead wirings 14, etc. are formed using a conductive organic material, the same method as in this embodiment can be used. As the scanning lines 12, the data lines 13, and the lead wirings 14 are made fine more and more, the pitch between wirings is decreased, and wiring formed by the ink jet method has a limitation of resolution. In such a case, when an unnecessary conductive portion (a portion where wirings overlap each other due to wetting spread of the solution or scattering or dropping error of the solution) formed between wirings is irradiated with light to decrease conductivity, a leakage between wirings can be prevented.

Second Embodiment

Figure 7:
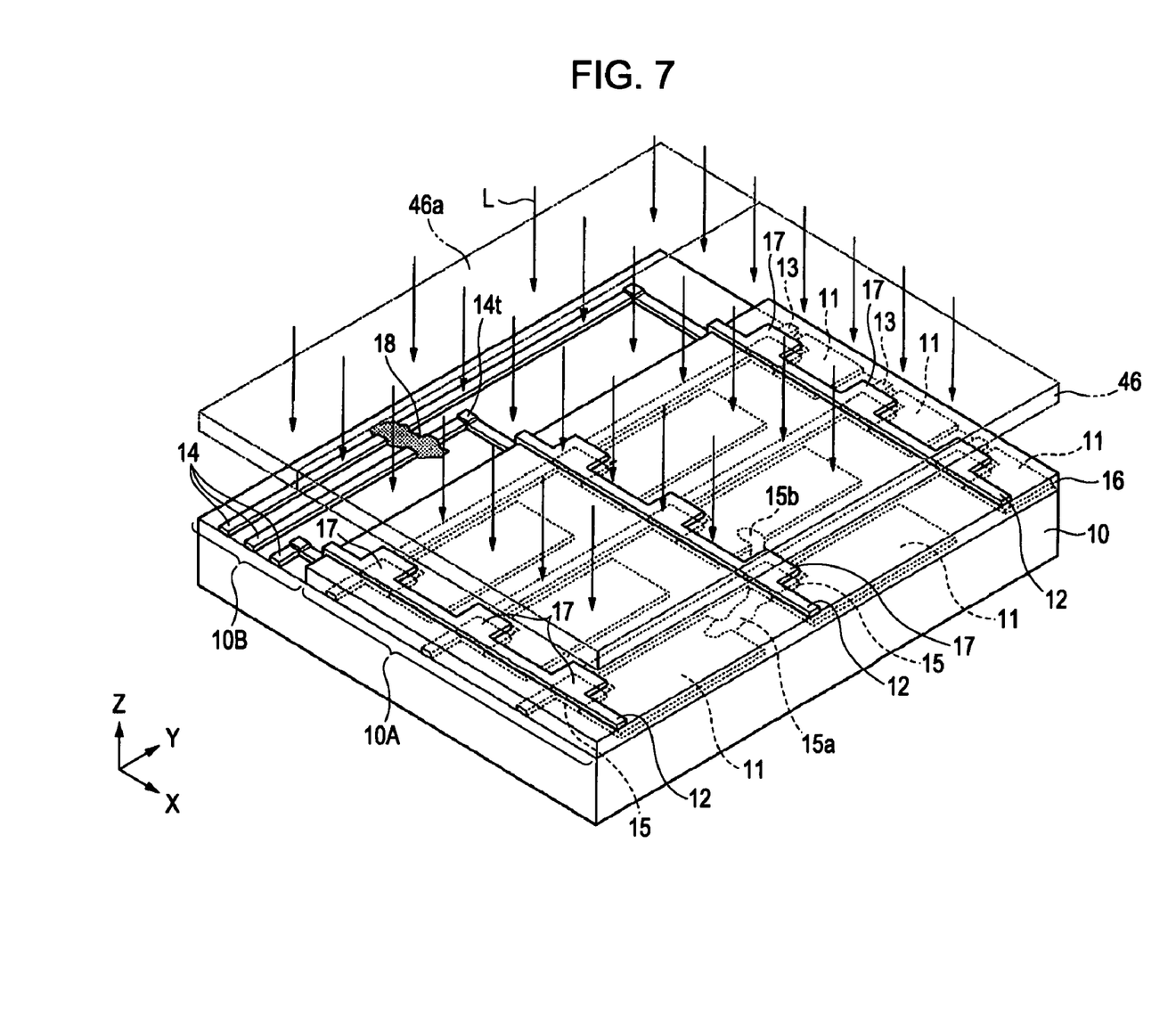
FIG. 7 is a drawing illustrating a method for manufacturing an electro-optic device according to a second embodiment.

FIG. 7 is a drawing illustrating a light irradiation step according to a second embodiment. FIG. 7 corresponds to FIG. 6 of the first embodiment. In the second embodiment, a semiconductor layer 18 in a wiring region 10B is irradiated with light L using a planar light source and a mask 46. The mask 46 is provided with a light-transmitting region 46a for the wiring region 10B so that the entire surface of the wiring region 10B is irradiated with the light L at a time. As the light L, the same light L as in the first embodiment can be used. In this method, since the entire wiring region is irradiated with the light L, all semiconductor layers present in the wiring region 10B can be processed by one time of treatment. Therefore, the manufacturing process can be simplified, and the process cost can be decreased. Further, since the display region 10A is not irradiated with the light L, it is necessary to irradiate semiconductor layers 15a and 15b in the display region 10A in another step. As a method for this irradiation, the method shown in FIG. 6 can be used.

Third Embodiment

Figure 8A:
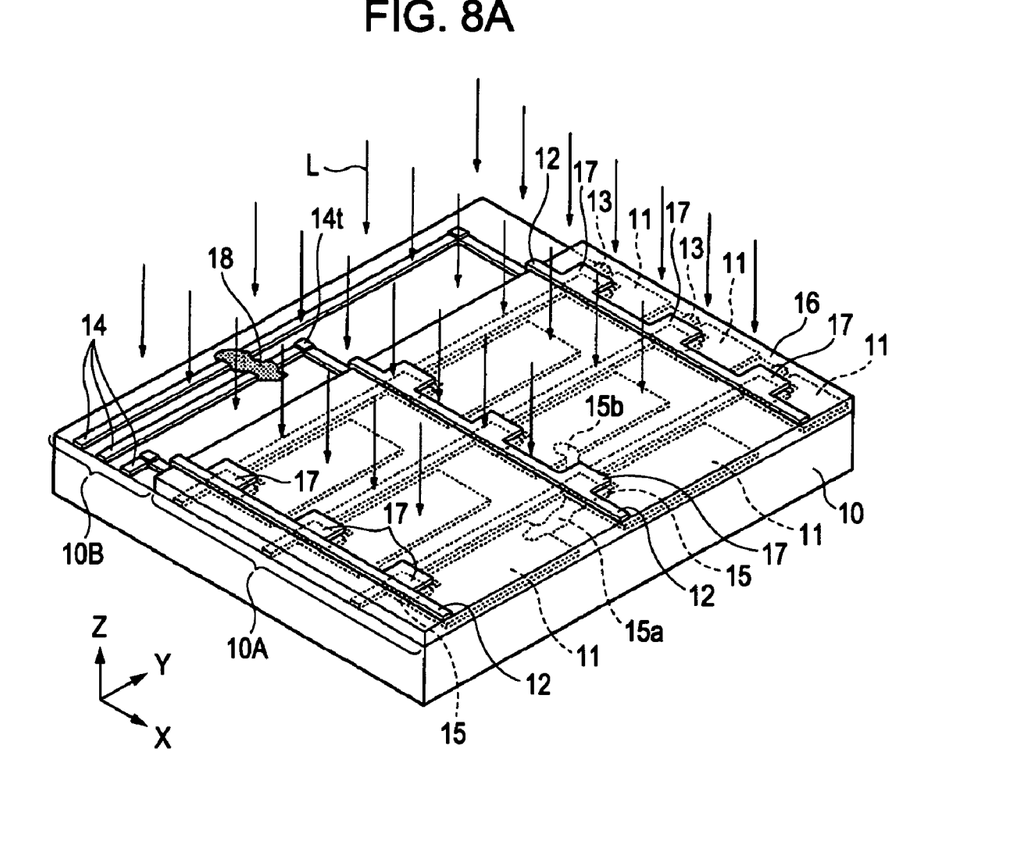
FIGS. 8A and 8B are drawings illustrating a method for manufacturing an electro-optic device according to a third embodiment.
Figure 8B:
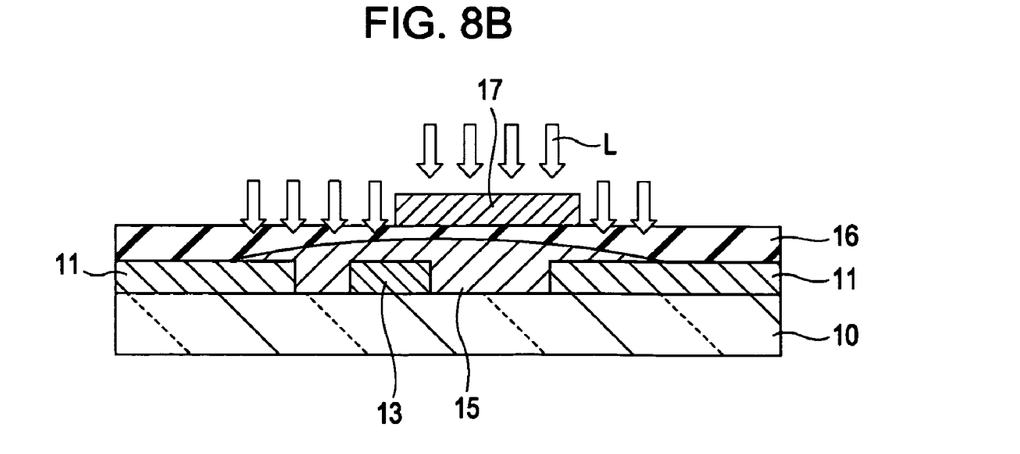

FIGS. 8A and 8B are drawings illustrating a light irradiation step according to a third embodiment. FIG. 8A corresponds to FIG. 6 of the first embodiment, and FIG. 8B is a sectional view of an organic TFT 30. In the third embodiment, semiconductor layers 15a and 15b in a display region 10A, and 18 in a wiring region 10B are irradiated with the light using gate electrodes 17 as a mask. As the light L, the same light L as in the first embodiment can be used. In this method, since the entire region of the substrate is irradiated with the light L, all semiconductor layers present in the display region 10A and the wiring region 10B can be processed by one time of treatment. Also, since the gate electrodes 17 are used as a mask, a new exposure mask need not be prepared. Therefore, the manufacturing process can be simplified, and the process cost can be decreased. In this embodiment, the channel region of the organic TFT 30 is protected by the gate electrode 17, and thus the electric characteristics of the organic TFT 30 are not degraded. In particular, the width of the gate electrode 17 is longer than the channel length, and thus the semiconductor layer can be securely protected.

Figure 9:
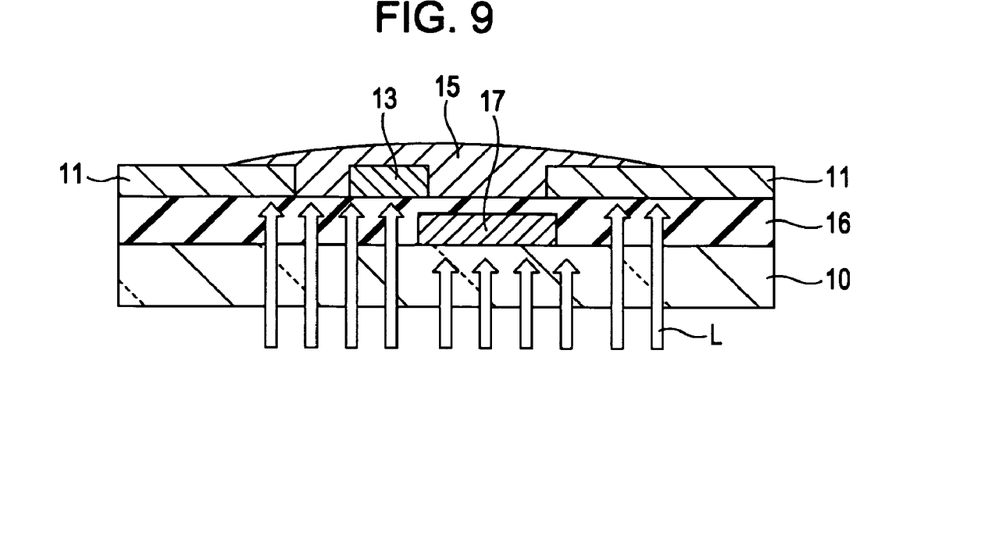
FIG. 9 is a drawing illustrating a modified example of the manufacturing method shown in FIGS. 8A an 8B.

Although, in this embodiment, a top-gate structure organic TFT 30 is formed, a bottom-gate structure organic TFT can be processed by the same method. FIG. 9 is a sectional view of a bottom-gate structure organic TFT. In this case, light L is applied to a semiconductor layer 15 from the gate side. Thus, it is necessary to use a light-transmitting substrate transmitting the light L as a substrate 10.

Electronic Apparatus

Figure 10:
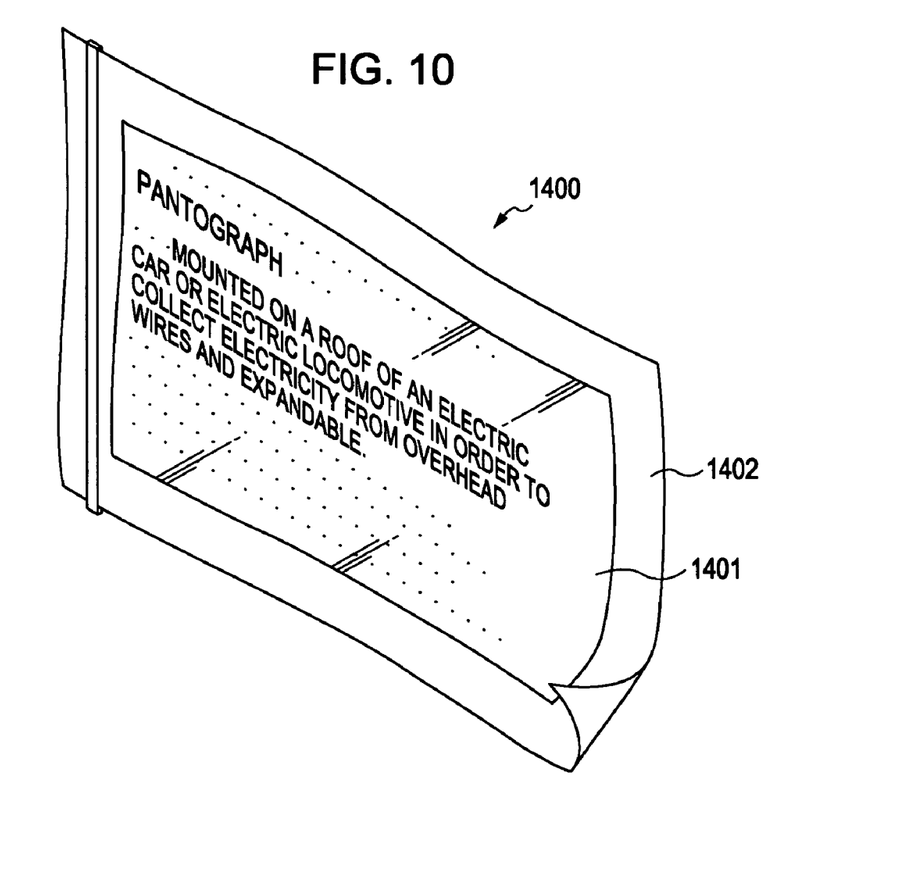
FIG. 10 is a schematic drawing showing the constitution of an electronic apparatus.

FIG. 10 is a schematic drawing showing the configuration of an electronic paper 1400 as an electronic apparatus including an organic device according to an embodiment of the invention. The electronic paper 1400 includes a display portion 1401 provided with the electro-optic device according to any one of the above-described embodiments, and a body 1402 including a rewritable sheet having texture and flexibility which are equivalent to those of general paper. The organic device according to any one of the embodiments of the invention can be mounted on not only the electronic paper but also various electronic apparatuses. Examples of such electronic apparatuses include an electronic book, a personal computer, a digital still camera, a liquid crystal television, a view-finder- or monitor direct-view-type video tape recorder, a car navigation system, a pager, an electronic notebook, an electronic calculator, a work processor, a work station, a picture telephone, a POS terminal, an apparatus with a touch panel.

What is claimed is:

1. A method for manufacturing an electro-optic device including thin-film transistors each having an electrically conductive organic film, a gate insulating film formed on the electrically conductive film, and a gate electrode formed on the gate insulating film, the method comprising:
   providing a substrate;
   providing a pixel electrode on the substrate;
   providing a data line on the substrate, the data line being separated from the pixel electrode;
   disposing a solution containing an electrically conductive organic material in a first region and in a second region, the first region being a region located between the pixel electrode and the data line and overlapping a portion of the pixel electrode and a portion of the data line, the second region being a region located outside the first region where the solution is undesirably disposed;
   drying the solution disposed in the first region and in the second region to form the electrically conductive organic film in the first region and in the second region;
   forming the gate insulating film on the pixel electrode, the data line, and the electrically conductive organic film disposed in the first region and the second region;
   forming the gate electrode on the gate insulating film over the portion of the electrically conductive organic film disposed in the first region; and
   irradiating the gate electrode and the electrically conductive organic film formed in the second region with light to decrease the electrical conductivity of the electrically conductive organic film formed in the second region;
   wherein the gate electrode prevents the portion of the electrically conductive organic film formed in the first region from being irradiated by the light.

2. The method according to claim 1, wherein the electrically conductive organic film is a π-conjugated organic film, and the light has a wavelength and energy with which π-electron orbital overlap in a molecular skeleton involved in π-conjugation of the π-conjugated organic film is cut by changing the steric structure of the molecular skeleton.

3. The method according to claim 2, wherein the light is visible light.

4. The method according to claim 1, wherein the electrically conductive organic film is a π-conjugated organic film, and the light has a wavelength and energy with which the electrically conductive organic film is oxidized in the presence of oxygen or moisture.

5. The method according to claim 4, wherein the light is ultraviolet light.

6. The method according to claim 1, further comprising:
   annealing the electrically conductive organic film after forming the electrically conductive organic film by heating the electrically conductive organic film to a temperature of ±50° C. from the glass transition temperature of the electrically conductive organic film,
   wherein the annealing is performed after the electrically conductive organic film is irradiated with the light.

* * * * *